(12) United States Patent
Grunow et al.

(10) Patent No.: US 7,740,916 B2
(45) Date of Patent: Jun. 22, 2010

(54) METHOD FOR THE PROTECTION OF EXTREME ULTRAVIOLET LITHOGRAPHY OPTICS

(75) Inventors: Philip A. Grunow, San Leandro, CA (US); Wayne M. Clift, Tracy, CA (US); Leonard E. Klebanoff, San Clemente, CA (US)

(73) Assignee: EUV LLC., Santa Clara, CA (US)

( * ) Notice: Subject to any disclaimer, the term of this patent is extended or adjusted under 35 U.S.C. 154(b) by 1163 days.

(21) Appl. No.: 10/818,586

(22) Filed: Apr. 5, 2004

(65) Prior Publication Data
US 2010/0124723 A1    May 20, 2010

(51) Int. Cl.
H05H 1/24 (2006.01)
C23C 16/00 (2006.01)
C23C 16/26 (2006.01)

(52) U.S. Cl. ............... 427/569; 427/248.1; 427/249.1; 427/249.7; 427/255.11

(58) Field of Classification Search ............... 427/249.7
See application file for complete search history.

(56) References Cited

U.S. PATENT DOCUMENTS

| 4,869,923 | A | * | 9/1989 | Yamazaki | 427/571 |
| 4,900,628 | A | * | 2/1990 | Ikegaya et al. | 428/408 |
| 5,281,274 | A | * | 1/1994 | Yoder | 118/697 |
| 5,314,540 | A | * | 5/1994 | Nakamura et al. | 118/723 DC |
| 5,427,827 | A | * | 6/1995 | Shing et al. | 427/577 |
| 5,464,656 | A | * | 11/1995 | Verkade | 427/248.1 |
| 5,799,028 | A | * | 8/1998 | Geels et al. | 372/49.01 |
| 6,031,598 | A | * | 2/2000 | Tichenor et al. | 355/67 |
| 6,206,528 | B1 | | 3/2001 | Ray-Chaudhuri et al. | |
| 6,291,341 | B1 | * | 9/2001 | Sharan et al. | 438/648 |

(Continued)

FOREIGN PATENT DOCUMENTS

WO     WO 8705409 A  *  9/1987

(Continued)

OTHER PUBLICATIONS

Klebanoff, L .E.; Clift, W. M.; Malinowski, M. E.; Steinhaus, C.; Grunow, P.; Bajt, S.; "Radiation-induced protective carbon coating for extreme ultraviolet optics", Mar./Apr. 2002, Journal of Vacuum Science & Technology, B: Microelectronics and Nanometer Structures, 20(2), 696-703.*

(Continued)

*Primary Examiner*—Michael Cleveland
*Assistant Examiner*—Michael G Miller
(74) *Attorney, Agent, or Firm*—Rutan & Tucker LLP

(57) ABSTRACT

A coating for the protection of optical surfaces exposed to a high energy erosive plasma. A gas that can be decomposed by the high energy plasma, such as the xenon plasma used for extreme ultraviolet lithography (EUVL), is injected into the EUVL machine. The decomposition products coat the optical surfaces with a protective coating maintained at less than about 100 Å thick by periodic injections of the gas. Gases that can be used include hydrocarbon gases, particularly methane, $PH_3$ and $H_2S$. The use of $PH_3$ and $H_2S$ is particularly advantageous since films of the plasma-induced decomposition products S and P cannot grow to greater than 10 Å thick in a vacuum atmosphere such as found in an EUVL machine.

11 Claims, 1 Drawing Sheet

U.S. PATENT DOCUMENTS

| | | |
|---|---|---|
| 6,664,554 B2 | 12/2003 | Klebanoff et al. |
| 6,927,887 B2 | 8/2005 | Naulleau |
| 7,016,030 B2 | 3/2006 | Naulleau |
| 7,081,992 B2 | 7/2006 | Tichenor et al. |
| 7,239,443 B2 | 7/2007 | Tichenor et al. |
| 2003/0051739 A1 | 3/2003 | Klebanoff et al. |
| 2003/0119750 A1 | 6/2003 | Demuth et al. |
| 2003/0229428 A1 | 12/2003 | Seifert et al. |
| 2004/0121243 A1* | 6/2004 | Chandhok et al. ............ 430/5 |
| 2004/0211448 A1 | 10/2004 | Klebanoff et al. |
| 2006/0282213 A1 | 12/2006 | Withrow et al. |

FOREIGN PATENT DOCUMENTS

WO      WO8705409 A1 *   9/1987

OTHER PUBLICATIONS

Klebanoff, L .E.; Clift, W. M.; Malinowski, M. E.; Steinhaus, C.; Grunow, P.; Bajt, S.; "Radiation-induced protective carbon coating for extreme ultraviolet optics", Mar./Apr. 2002, Journal of Vacuum Science & Technology, B: Microelectronics and Nanometer Structures, 20(2), 696-703.*

* cited by examiner

METHOD FOR THE PROTECTION OF EXTREME ULTRAVIOLET LITHOGRAPHY OPTICS

STATEMENT OF GOVERNMENT INTEREST

This invention was made with Government support under contract no. DE-AC04-94AL85000 awarded by the U.S. Department of Energy to Sandia Corporation. The Government has certain rights in the invention.

CROSS-REFERENCE TO RELATED APPLICATIONS

Not applicable.

FIELD OF THE INVENTION

This invention is directed generally to the use of a thin layer or coating, such as a carbon layer that can be produced by plasma decomposition of a hydrocarbon gas, or other film-forming gas, for protection of the optics, and particularly the plasma-facing condenser optics used in extreme ultraviolet lithography.

BACKGROUND OF THE INVENTION

Extreme ultraviolet lithography (EUVL) uses 10-14 nm photons to print integrated circuit features having dimensions in the range of 100 nm or smaller. The photons are generated by illuminating xenon with a laser system in a source chamber. A complete description of an EUVL machine can be found in U.S. Pat. No. 6,031,598, issued to Tichenor et al. Feb. 29, 2000.

Referring now to FIG. 1 that illustrates the arrangement of the source chamber 4. Laser beam 30 is directed by turning mirror 32 into the source chamber that is at sub-atmospheric pressure. Xenon, at high density, as a liquid or molecular clusters, created by cooling of the gas as it expands through a nozzle, is injected into a plasma generator 36. Interaction of laser beam 30 with the xenon gas creates a plasma that produces the extreme ultraviolet (EUV) radiation used for EUVL. The EUV radiation is collected by segmented collector 38 and directed toward pupil optics 42.

Segmented collector 38 is composed of a plurality of segments, typically six, each which is a Mo/Si multilayer mirror (MLM). A typical Mo/Si MLM used in EUVL is made by sputter depositing 40 pairs of alternating Mo and Si thin films, with a total (Si+Mo) bilayer thickness of ~7 nm and a ratio of (Mo)/(Mo+Si) thickness of ~0.4. It is preferred that the topmost layer be Si in order to minimize surface oxidation during routine handling. The thickness of this topmost or "capping" layer is ≈4.3 nm. However, these MLM segments, being proximate the region where the xenon plasma is generated 36, are exposed to energized atoms, ions, and particles from the plasma that erode, oxidize and thereby degrade the mirror quality and shorten its useful life. A method is required for protecting the plasma-facing optics used in EUVL from the degrading effects of the proximate plasma.

SUMMARY OF THE INVENTION

Accordingly, the present invention is directed generally to a method for protecting optical surfaces from the degrading effects of plasma interaction by depositing and maintaining a thin protective layer on the surface of plasma-facing optics. The protective layer must be thin enough so as not to substantially degrade the reflectivity of the optic and, yet, provide protection from the degrading effects of the nearby plasma. A carbon layer produced by the decomposition of methane can be used to provide a protective layer.

DETAILED DESCRIPTION OF THE INVENTION

The present invention pertains to the use of a gas, preferably a hydrocarbon gas, and most preferably methane, that can be decomposed by an energetic plasma, such as the xenon plasma used for EUVL, to form a coating for optical surfaces. The purpose of this coating is to protect the optical surfaces from the degrading effects of the proximate xenon plasma.

The present invention will be illustrated and exemplified by the following example.

EXAMPLE

Figure 1:
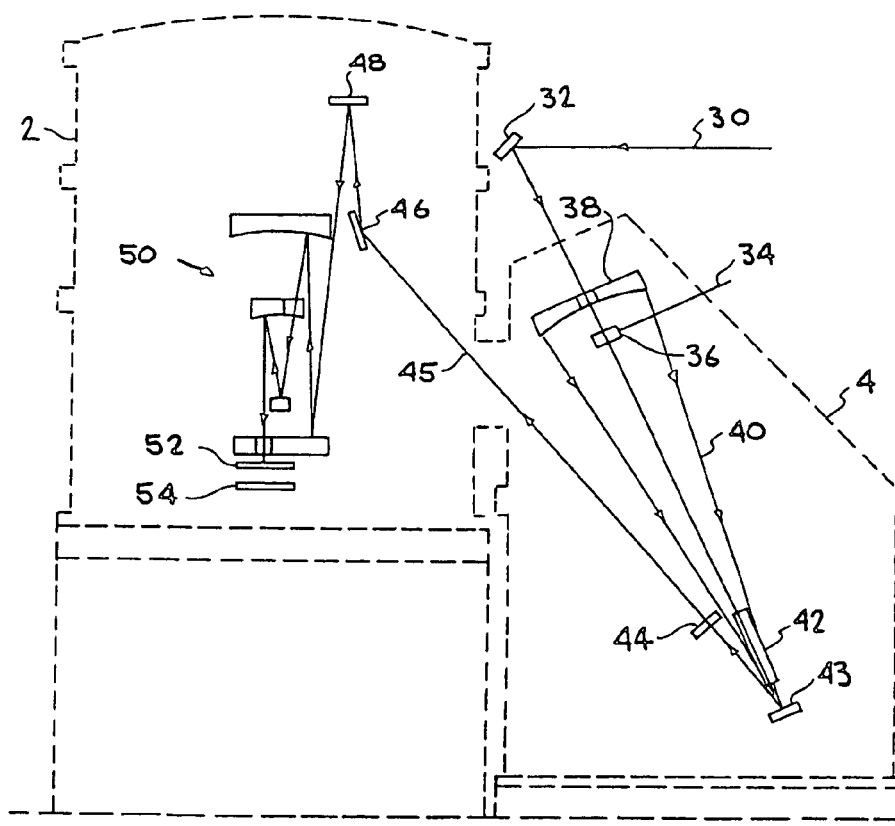
FIG. 1 shows prior art EUVL source chamber.
Figure 2:
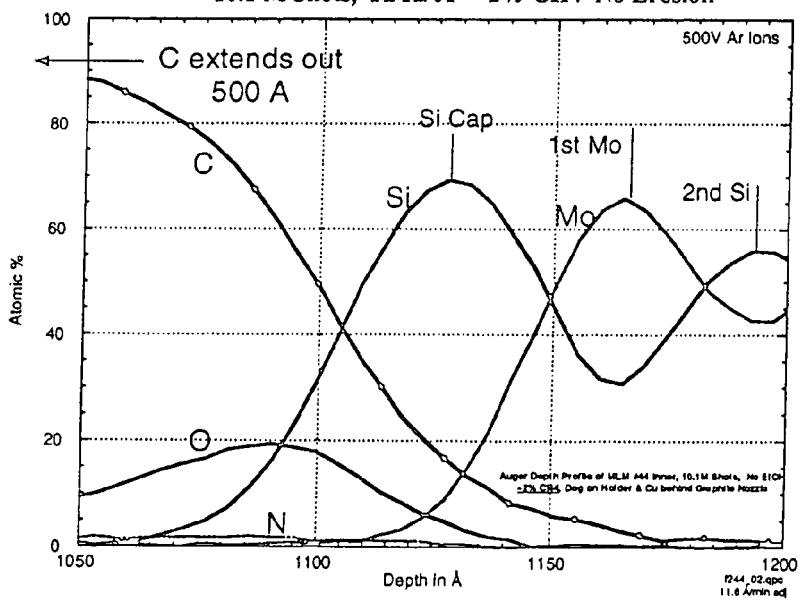
FIG. 2 is an Auger scan of a carbon coated optic.

As discussed above, xenon, at high density, as a liquid or a molecular cluster, created by cooling of the gas as it expands through a nozzle, is injected into a plasma generator where interaction of a laser beam with the xenon gas creates a plasma that produces the extreme ultraviolet (EUV) radiation used for EUVL. Methane gas in a partial pressure of about 2% of the xenon pressure was injected into the plasma generator along with the xenon gas. The lithography machine was run for a total of about $1 \times 10^7$ shots. The results of that run are shown in FIG. 2. A carbon layer about 500 Å thick was produced on the MLM surface. There was no evidence of either erosion or sputtering of the terminal Si layer, as indicated by the approximately 80 Å spacing between the first and second Si peaks. Moreover, there was no indication that the terminal Si layer had been oxidized beyond that originally present.

As shown above, a carbon film is produced on surfaces exposed to a combination of a hydrocarbon gas and a plasma. If the plasma is not present a carbon film will not be produced. By way of example, a MLM was exposed to about $1 \times 10^{-5}$ T of methane and 13.4 nm radiation (5 mW/mm$^2$) for about 6 hours. No change in EUV reflectivity was observed and Auger, analysis of the MLM surface showed no accumulated carbon. Thus, the invention offers additional advantage in that surfaces exposed to the hydrocarbon gas but not to the plasma will not have a carbon deposited thereon.

It is known in the art that a carbon film about 100 Å thick on a MLM will absorb about 6% of incident EUV radiation, thus any carbon film formed on the surface of a MLM should be thinner than 100 Å. The process disclosed herein is completely flexible in that the thickness of the protective carbon layer produced by plasma decomposition of the hydrocarbon gas can be controlled by controlling the influx of the hydrocarbon gas. When a carbon layer of desired thickness has been built up the hydrocarbon gas flow can be turned off. After time, the carbon film will be eroded away by the action of the plasma and the flow of hydrocarbon gas can be periodically resumed to restore the carbon film. The thickness of the carbon film can be monitored by thickness monitoring means adjacent the MLM. For example, a quartz crystal thickness monitor can be used to gauge the thickness of the carbon film and a signal from the quartz crystal apparatus can be used to control hydrocarbon gas flow.

In the example above, a hydrocarbon gas (methane) was used to produce a protective carbon film, wherein the partial pressure of the methane gas can be in the range of from about 0.001% to 2%. However, as will be appreciated by those skilled in the art, other gases can be used to produce protective films that can have the desired protective properties. By way of example, $H_2S$ and $PH_3$ will deposit films of P and S onto surfaces in the presence of a plasma. Moreover, both S and P are less absorptive of EUV radiation that carbon. A 10 Å film of P will absorb less than about 0.02% of incident EUV radiation. A S film of the same thickness will absorb less than about 0.04% of the same radiation, while a 10 Å film of carbon will absorb greater than 0.6% of the incident EUV radiation. Furthermore, in a system at sub-atmospheric pressure such as would be encountered in an EUVL machine, S or P films greater than 10 Å in thickness cannot be grown making the process for growing protective films disclosed herein self terminating.

We claim:

1. A method for protecting the surfaces of optics used in extreme ultraviolet (EUV) lithography, comprising:
   providing an enclosed space in an EUV lithography machine having a collector optic disposed therein, wherein the enclosed space is at sub-atmospheric pressure, and maintaining the space at said sub-atmospheric pressure;
   producing a plasma in the enclosed space which produces EUV radiation that is collected by the optic; and
   injecting a gas into the enclosed space, wherein the gas is decomposed by the plasma to provide a protective layer on the surface of the optic; and
   forming the protective layer on the surface of the optic.

2. The method of claim 1, wherein the optic is a multilayer mirror.

3. The method of claim 2, wherein the multilayer mirror is a Mo/Si multilayer mirror.

4. The method of claim 1, wherein the plasma is a xenon plasma.

5. The method of claim 1, wherein the gas is $PH_3$, or $H_2S$.

6. The method of claim 1, wherein the gas is methane.

7. The method of claim 6, wherein the concentration of methane is at a partial pressure in the range of from 0.001% to about 2% of the pressure of xenon injected for producing the plasma.

8. The method of claim 1, wherein said injecting is periodic in nature.

9. The method of claim 1 where the plasma is produced by directing a laser beam to interact with xenon in the enclosed space, which produces the EUV radiation.

10. The method of claim 9 wherein introducing the gas comprises injecting a hydrocarbon gas together with the xenon into a plasma generator in the EUV lithography machine.

11. The method of claim 10 wherein the xenon is injected as a liquid or a molecular cluster.

* * * * *